United States Patent
Thomas et al.

(10) Patent No.: US 10,474,517 B2
(45) Date of Patent: Nov. 12, 2019

(54) TECHNIQUES OF STORING OPERATIONAL STATES OF PROCESSES AT PARTICULAR MEMORY LOCATIONS OF AN EMBEDDED-SYSTEM DEVICE

(71) Applicant: AMERICAN MEGATRENDS INTERNATIONAL, LLC, Norcross, GA (US)

(72) Inventors: Satheesh Thomas, Dunwoody, GA (US); J. Vinodhini, Chennai (IN); Venkatesan Balakrishnan, Chennai (IN); Baskar Parthiban, Johns Creek, GA (US)

(73) Assignee: AMERICAN MEGATRENDS INTERNATIONAL, LLC, Norcross, GA (US)

( * ) Notice: Subject to any disclaimer, the term of this patent is extended or adjusted under 35 U.S.C. 154(b) by 119 days.

(21) Appl. No.: 15/212,751

(22) Filed: Jul. 18, 2016

(65) Prior Publication Data

US 2018/0018127 A1 Jan. 18, 2018

(51) Int. Cl.
| | |
|---|---|
| *G06F 12/00* | (2006.01) |
| *G06F 11/07* | (2006.01) |
| *G06F 11/22* | (2006.01) |
| *G05B 11/01* | (2006.01) |
| *G06F 11/36* | (2006.01) |
| *G11C 16/10* | (2006.01) |

(52) U.S. Cl.
CPC ...... *G06F 11/0766* (2013.01); *G06F 11/2236* (2013.01); *G05B 11/01* (2013.01); *G06F 11/3636* (2013.01); *G11C 16/10* (2013.01)

(58) Field of Classification Search
CPC ..... G11C 16/10; G05B 11/01; G06F 11/3636; G06F 11/2236
USPC ........................................................ 711/154
See application file for complete search history.

(56) References Cited

U.S. PATENT DOCUMENTS

| | | | |
|---|---|---|---|
| 7,240,222 B1 * | 7/2007 | Falik ..................... | G06F 1/3209 713/300 |
| 2004/0078682 A1 * | 4/2004 | Huang ................. | G06F 11/0748 714/37 |

(Continued)

FOREIGN PATENT DOCUMENTS

JP 2001117797 A * 4/2001

*Primary Examiner* — Mardochee Chery
(74) *Attorney, Agent, or Firm* — Locke Lord LLP; Tim Tingkang Xia, Esq.

(57) ABSTRACT

A method, a computer-readable medium, and an apparatus are provided. The apparatus may be an embedded-system device. The embedded-system device determines a respective operational state of each of one or more processes of the embedded-system device. The embedded-system device stores the respective operational state of each of the one or more processes at a memory location in a respective memory area for the each process in a memory of the embedded-system device. The embedded-system device stores the memory locations associated with the one or more processes in a register in the memory. The embedded-system device obtains, from the register, a memory location of at least one process of the one or more processes. The embedded-system device obtains, based on the memory location of the at least one process, the stored operational state of the at least one process from the respective memory area for the at least one process.

20 Claims, 5 Drawing Sheets

(56) References Cited

U.S. PATENT DOCUMENTS

2009/0077412 A1\* 3/2009 Langford ............ G06F 11/0709
714/4.1
2016/0266633 A1\* 9/2016 Rabii .................... G06F 1/3203

\* cited by examiner

TECHNIQUES OF STORING OPERATIONAL STATES OF PROCESSES AT PARTICULAR MEMORY LOCATIONS OF AN EMBEDDED-SYSTEM DEVICE

BACKGROUND

Field

The present disclosure relates generally to computer management devices, and more particularly, to techniques of obtaining state information of processes of a device.

Background

Considerable developments have been made in the arena of server management. An industry standard called Intelligent Platform Management Interface (IPMI), described in, e.g., "IPMI: Intelligent Platform Management Interface Specification, Second Generation," v.2.0, Feb. 12, 2004, defines a protocol, requirements and guidelines for implementing a management solution for server-class computer systems. The features provided by the IPMI standard include power management, system event logging, environmental health monitoring using various sensors, watchdog timers, field replaceable unit information, in-band and out of band access to the management controller, simple network management protocol (SNMP) traps, etc.

A component that is normally included in a server-class computer to implement the IPMI standard is known as a Baseboard Management Controller (BMC). A BMC is a specialized microcontroller embedded on the motherboard of the computer, which manages the interface between the system management software and the platform hardware. The BMC generally provides the "intelligence" in the IPMI architecture.

A BMC may require a firmware image to make them operational. "Firmware" is software that is stored in a read-only memory (ROM) (which may be reprogrammable), such as a ROM, programmable read-only memory (PROM), erasable programmable read-only memory (EPROM), electrically erasable programmable read-only memory (EEPROM), etc. Such firmware may be considered as an embedded-system. The BMC may be considered an embedded-system device. There is a need to more effectively debug processes of the BMC or other embedded-system devices.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be an embedded-system device. The embedded-system device determines a respective operational state of each of one or more processes of the embedded-system device. The embedded-system device stores the respective operational state of each of the one or more processes at a memory location in a respective memory area for the each process in a memory of the embedded-system device. The embedded-system device stores the memory locations associated with the one or more processes in a register in the memory. The embedded-system device obtains, from the register, a memory location of at least one process of the one or more processes. The embedded-system device obtains, based on the memory location of the at least one process, the stored operational state of the at least one process from the respective memory area for the at least one process.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
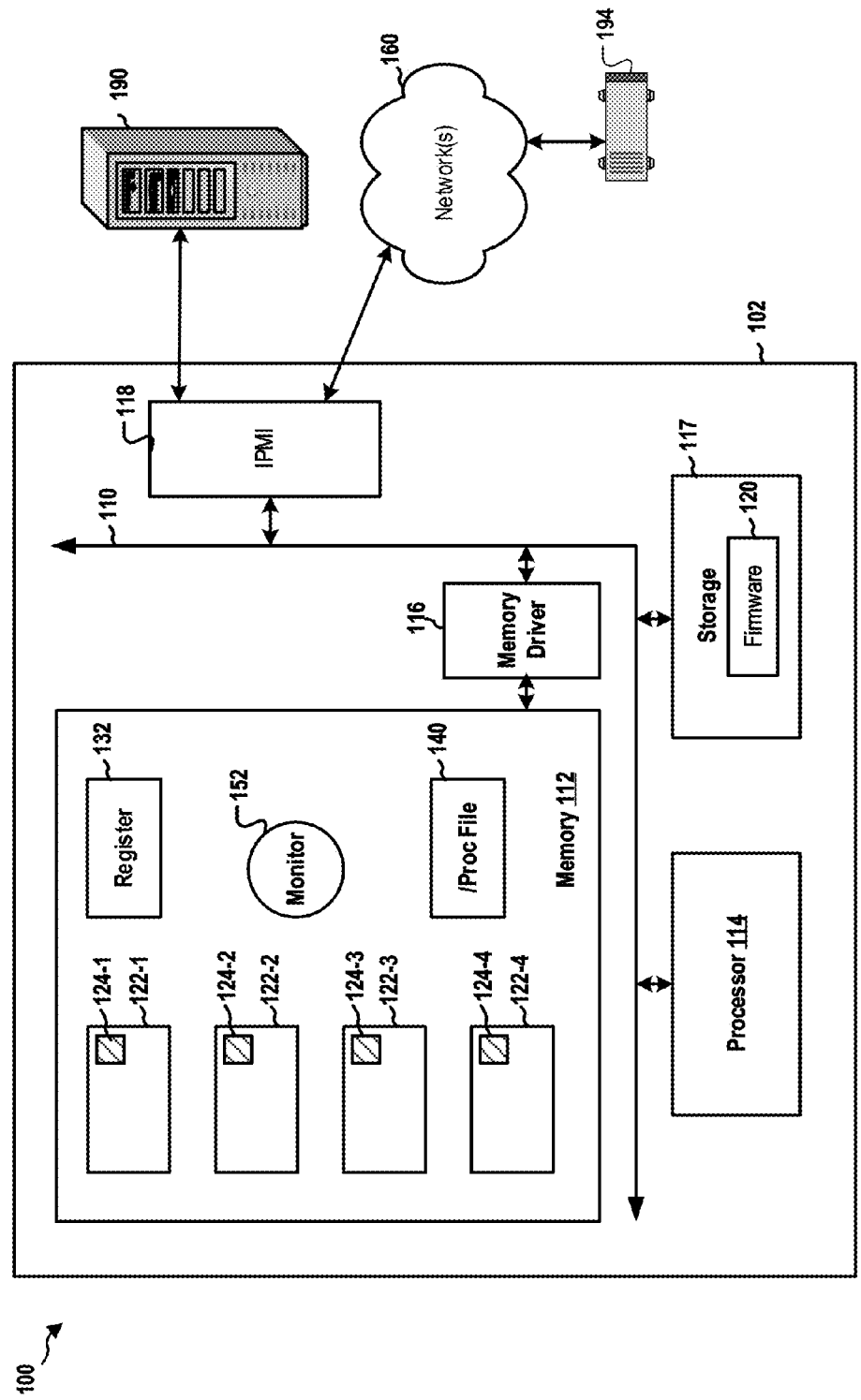
FIG. 1 is a diagram illustrating an embedded-system device.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of computer systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

In an embedded-system device such as a BMC, debugging a defect of the embedded system after the embedded-system device has been shipped to a customer is a challenge. This is especially true when the system embedded has multiple processes with interdependency.

A process of an embedded-system device may be stuck or hung due to a variety of reasons. In certain circumstances, a particular process of the embedded-system device may be waiting infinitely on another process or device to get a response needed in order to execute the next instruction of the particular process. In certain circumstances, a particular process of the embedded-system device may be waiting infinitely for a change in condition on another process or device. For example, the particular process may be waiting for a power-on condition prior to polling of sensor status.

In certain circumstances, a user may see that a feature of the embedded-system device is not working as expected, but the processes of the system embedded may not be stuck at any place. For example, the code in a particular process may be executing an instruction path corresponding to a host in a power-off state, while the host may actually be in a power-on state.

Each process of an embedded-system device during its operation may be considered as going through different operational states. When the number of processes of the embedded-system device is large, and when the number of operational states for each process are large, the system embedded is complex, as the possible combinations of states of different processes is large. As an example, for a simple system with 10 process each having 2 states, the possible combinations are 2 by the power of 10, i.e., 1024. An embedded-system device may include a large number of processes and a large number of states. As such, there is a need to improve the debugging process of an embedded-system device.

FIG. 1 is a diagram 100 illustrating an embedded-system device 102. The embedded-system device 102 has a processor 114, a memory 112, a memory driver 116, and a storage 117. The embedded-system device 102 may support IPMI and may have an IPMI interface 118. For example, the embedded-system device 102 may be a baseboard management controller (BMC) that is in communication with, through the IPMI interface 118, a host computer 190 and/or a network device 194. The IPMI communication between the BMC and the network device 194 may be carried over a network 160. The BMC may manage the host computer 190.

Further, the storage 117 may store BMC firmware 120. When the processor 114 executes the BMC firmware 120, the processor 114 loads code and data of one or more processes of the BMC firmware 120 into the memory 112. This example only shows 4 processes, i.e., processes 122-1, 122-2, 122-3, 122-4, in the memory 112. It is understood that any suitable number of processes may be executed by the processor 114 and loaded into the memory 112. The memory 112, the processor 114, the memory driver 116, the storage 117, and the IPMI interface 118 may be in communication with each other through a communication channel 110 such as a bus architecture.

Figure 2:
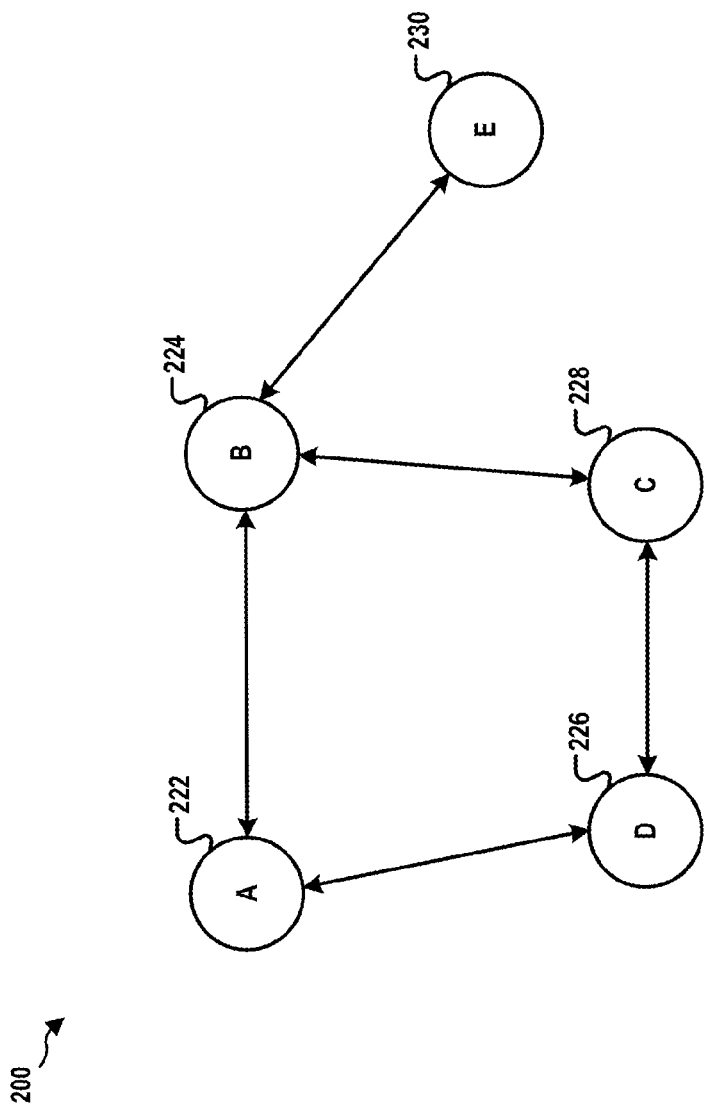
FIG. 2 is a diagram illustrating operational states of a process of an embedded-system device.

As described supra, each of the processes executed by the processor 114 may have various operational states, and during its operation the process is in one of those states at a given time. FIG. 2 is a diagram 200 illustrating operational states of the process 122-1. As shown, the process 122-1 may have 5 different operational states 222, 224, 226, 228, 230. During operation, the process 122-1 may transition from one of those states to another (e.g., from the operational state-A 222 to the operational state-B 224).

Further, as an example, the process 122-1 may perform one or more functions such as a write function, a read function, a listen function, a send function, and a wait function. The process 122-1 may be in one of the operational states 222, 224, 226, 228, 230 when performing one of the functions. For example, when the process 122-1 is performing the listen function, the process 122-1 may accordingly considers itself having been transitioned to the operational state-B 224 (e.g., a listen state).

Referring back to FIG. 1, as described supra, the processor 114 utilizes the memory 112 to execute the BMC firmware 120, which includes the processes 122-1, 122-2, 122-3, 122-4. Each of the processes 122-1, 122-2, 122-3, 122-4 occupies a specific memory area of the memory 112.

The processes 122-1, 122-2, 122-3, 122-4 each may, from time to time, determine their respective current operational states. In certain configurations, a process may determine its operational state periodically (e.g., every 5, 10, 15 seconds, etc.). For example, the process may periodically determine what function or task the process is performing, and then may determine the operational state of the process based on the function or task (e.g., a write function) being. In certain configurations, a process may determine its operational state each time the process invokes a function or a routine based on the function or routine invoked. For example, upon entering a write function, the process may determine that the process is in a write state.

Further, each time after determining its operational state, a process may use a state variable to record the current operational state of the process. The state variable may be assigned one or more values, each of which corresponds to an operational state of the process. For example, the variable may have a name of "OP STATE" and may be an integer type; each operational state of the process may be assigned a specific integer value. For example, the operational states 222, 224, 226, 228, 230 of the process 122-1 may be assigned values of 0-4.

Further, each process of the processes 122-1, 122-2, 122-3, 122-4 may allocate a dedicated memory sub-area within the memory area utilized by that process to store the state variable of the process and, optionally, information data associated with the state variable, as described infra. In this example, the processes 122-1, 122-2, 122-3, 122-4 may store their state variables in memory sub-areas 124-1, 124-2, 124-3, 124-4, respectively. The size of each of the memory sub-areas 124-1, 124-2, 124-3, 124-4 may be a respective, predetermined value and may be expanded as needed. In this example, the memory sub-areas 124-1, 124-2, 124-3, 124-4 each have a size of 1 KB or 4 KB. Further, the location of the memory sub-areas 124-1, 124-2, 124-3, 124-4 may be determined dynamically by the processes 122-1, 122-2, 122-3, 122-4 during the runtime.

In certain configurations, upon the first time a particular process of the processes 122-1, 122-2, 122-3, 122-4 determines the current operational state of the particular process, the particular process set the state variable with a value corresponding to the operational state. Then, the particular process may store the state variable to the allocated memory sub-area of the particular process.

Subsequently, each time a process determines its current operational state, the process may update the value of the state variable in the corresponding memory sub-area. The updating procedure does not have significant negative impact on the performance of the process.

In addition to the state variable indicating the operational state, a process may also store information data associated with the operational state in the corresponding memory sub-area. For example, the process 122-1 may be in a write operational state, and the information data may indicate the medium or destination to which the data is written.

Further, because the location of each of the memory sub-areas 124-1, 124-2, 124-3, 124-4 is determined dynamically by the corresponding process, other processes may not know or be configured with the location of the memory sub-area in advance. Accordingly, in one configuration, the BMC firmware 120 may create a register 132 at a predefined location in the memory area. Each of the processes 122-1, 122-2, 122-3, 122-4 may, after allocating the corresponding one of the memory sub-areas 124-1, 124-2, 124-3, 124-4, store the location of the corresponding memory sub-area in the register 132. In one example, a virtual memory address or a physical memory address of a starting point of the memory sub-area may be stored in the register 132 to indicate the location of the memory sub-area. As described supra, the size of each of the memory sub-areas 124-1, 124-2, 124-3, 124-4 may be pre-configured. As such, the entire memory sub-area may be determined based on the stored location and the pre-configured size.

Further, the process ID of a process or other identifier of the process may also be stored in the register 132 to identify the process associated with a stored location. In one example, the register 132 may be a dedicated folder in a temporary file system created by the BMC firmware 120. Each of the processes 122-1, 122-2, 122-3, 122-4 stores the memory location of the corresponding one of the memory sub-areas 124-1, 124-2, 124-3, 124-4 in a file whose name matches the feature or process ID of that process.

As such, another process can read the location of the memory sub-area of a particular process from the register 132 based the process ID or other identifier of the particular process. In particular, a monitor process 152 of the BMC firmware 120 may, as described infra, read the locations of the memory sub-areas 124-1, 124-2, 124-3, 124-4 and then read the state variables and the associated information data stored in the memory sub-areas 124-1, 124-2, 124-3, 124-4.

In certain configurations, the BMC firmware 120 may support a /proc file system 140 that provides access to the memory 112 through virtual memory addresses. The /proc file system 140 maps to the physical memory addresses of the memory 112 to virtual memory addresses.

In certain configurations, the monitor process 152 may be allowed by the BMC firmware 120 to access the memory sub-areas 124-1, 124-2, 124-3, 124-4 through the /proc file system 140. The memory location of each of the memory sub-areas 124-1, 124-2, 124-3, 124-4 is stored in the register 132 as a virtual memory address. The monitor process 152 obtains the virtual memory address of the memory sub-area of a target process and then read the state variable and the associated information data stored in the memory sub-area through the /proc file system 140 based the virtual memory address. That is, the monitor process 152 may calculate the start virtual memory address and the end virtual memory address of the memory sub-area of the target process and then read all the data stored in the memory sub-area through the /proc file system 140 based on the virtual memory addresses.

In certain configurations, the monitor process 152 may not be allowed by the BMC firmware 120 to use the /proc file system 140. The monitor process 152 may obtain information of a target process from the /proc file system 140, and then may compute the actual physical memory address of the memory location of the memory sub-area of the target process based on the virtual memory address of the memory sub-area stored in the register 132. The monitor process 152 may access the memory sub-area through the memory driver 116 based on the physical memory address. More specifically, the monitor process 152 may obtain process information for the target process from the /proc file system 140 based on the process ID of the target process. The process information provides mapping of the different virtual memories to the physical memory. The monitor process 152 knows the location (e.g., the start virtual memory address) of the memory sub-area of the target process. Then the monitor process 152 can compute the physical memory addresses of the memory sub-area based on the virtual memory addresses and the process information. The monitor process 152 can read the data in the memory sub-area through the memory driver 116 based on the physical memory addresses.

The monitor process 152 may monitor status of the processes 122-1, 122-2, 122-3, 122-4. For example, the monitor process 152 may check if a particular process is still alive periodically (e.g., every 30 seconds, 60 seconds, 90 seconds, etc.). When the monitor process 152 determines that any of the processes 122-1, 122-2, 122-3, 122-4 is terminated, the monitor process 152 may decide to store, in the storage 117 or any other suitable non-volatile memory, the state variable and the associated information data of the terminated process or the state variables and the associated information data of all the process. More specifically, the monitor process 152 may read the memory locations of the memory sub-areas 124-1, 124-2, 124-3, 124-4 from the register 132. The monitor process 152 then reads the stored state variables and, if any, the associated information data, from the memory sub-areas 124-1, 124-2, 124-3, 124-4. The monitor process 152 may store a current copy the state variables and the information data to the storage 117. The monitor process 152 may, at more than occasions in a single boot, determines that a process of the processes 122-1, 122-2, 122-3, 122-4 has been terminated. The monitor process 152 may be configured to store a predetermined number (e.g., 5, 10, 15, etc.) of copies of the state variables and the associated information data in the storage 117. As such, the embedded-system device 102 maintains historical information of the states of the processes 122-1, 122-2, 122-3, 122-4 in a period of time. In certain configurations, the stored copies may be erased after each time the embedded-system device 102 is booted. In certain configurations, the stored copies are not erased after a re-boot.

In certain circumstances, a process may be alive and is waiting for another process. For example, the process 122-1 may be an IPMI process and the process 122-2 may be a storage process. The IPMI process may try to read a redundant array of independent disks (RAID) state from the storage process, but is not able to obtain the expected data from the storage process. After the IPMI process (i.e., the process 122-1) has waited for a predetermined time period, the IPMI process may determine that the IPMI process or the storage process (i.e., the process 122-2) is hung. The IPMI process may notify the monitor process 152 to read the state variables and the associated information data from the memory sub-areas 124-1, 124-2, 124-3, 124-4, and may store the state variables and the information data to the storage 117 as described supra.

The copies stored in the storage 117 may be downloaded through a data transfer protocol supported by the embedded-system device 102. In one example, the embedded-system device 102 is a BMC supporting IPMI. The embedded-system device 102 may receive an IPMI command requesting copies of the state variables and the associated information data through the IPMI interface 118 from the network device 194 or the host computer 190. The monitor process 152 may, through the IPMI interface 118, provide in an IPMI response copies stored in the storage 117 to the network device 194 or the host computer 190.

In another example, the embedded-system device 102 is a BMC supporting IPMI. The embedded-system device 102 may receive an IPMI command requesting the current state variables and the associated information data, rather than the historical data stored in the storage 117. The embedded-system device 102 may trigger the monitor process 152 to obtain the state variables and data from the memory sub-areas 124-1, 124-2, 124-3, 124-4 as described supra. The monitor process 152 may, through the IPMI interface 118, provide in an IPMI response copies stored in the storage 117 to the network device 194 or the host computer 190.

In certain circumstances, the IPMI command may include one or more parameter (e.g., a process ID or other identifiers) indicating one or more target processes of the processes 122-1, 122-2, 122-3, 122-4. The monitor process 152 may obtain the state variables and the information data of the target processes from the memory sub-areas 124-1, 124-2, 124-3, 124-4 or the storage 117 based on the one or more parameters.

Figure 3:
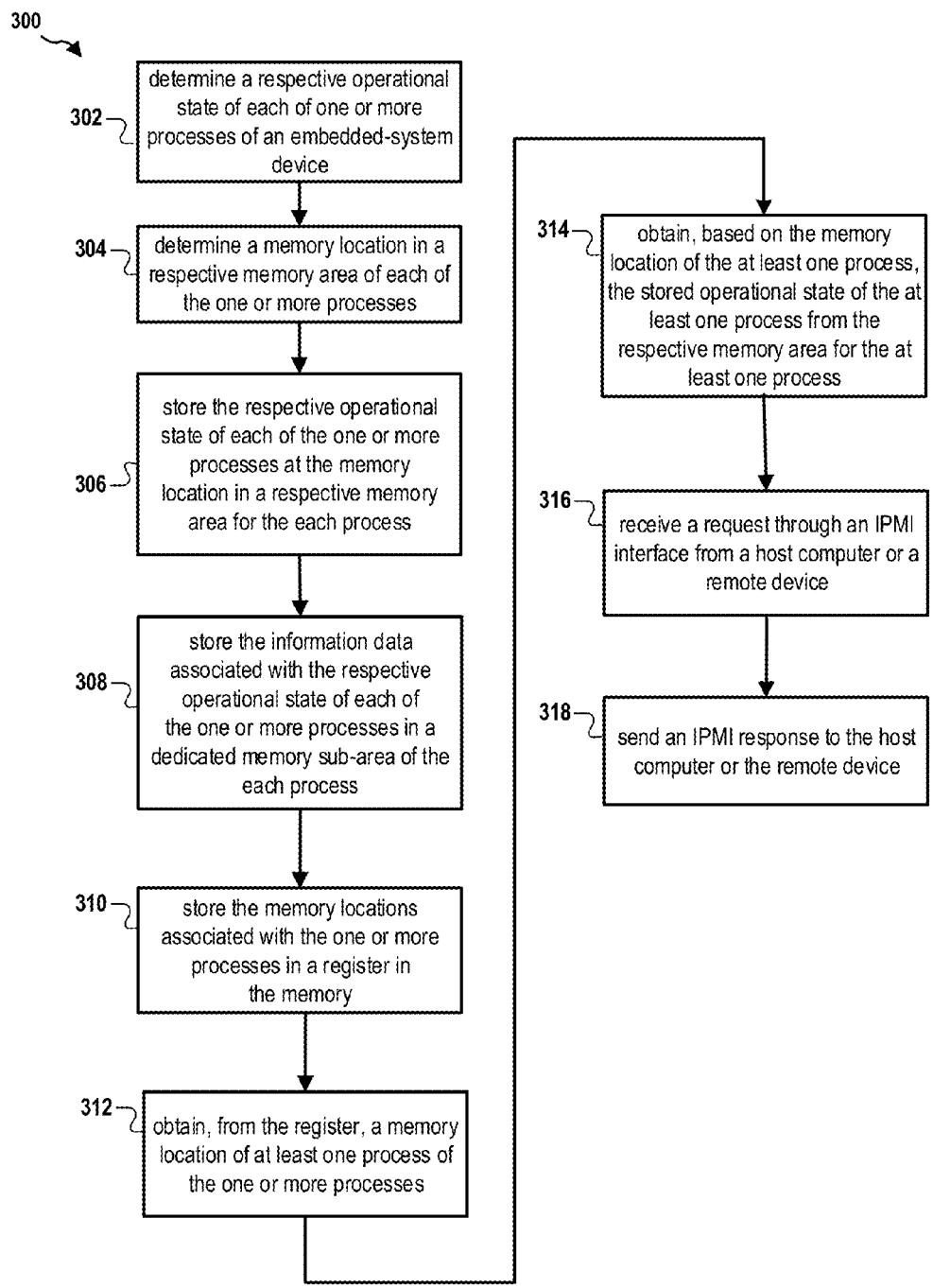
FIG. 3 is a flow chart of a method (process) for obtaining operational states of processes of an embedded-system device.

FIG. 3 is a flow chart 300 of a method (process) for obtaining operational states. The method may be performed by an embedded-system device (e.g., the embedded-system device 102 and the apparatus 102/102').

At operation 302, the embedded-system device determines a respective operational state of each of one or more processes of the BMC. At operation 304, the embedded-system device determines a memory location in a respective memory area of each of the one or more processes in a memory of the BMC. At operation 306, the embedded-system device stores the respective operational state of each of the one or more processes at the memory location in the respective memory area for the each process.

In certain configurations, the respective memory location associated with each of the one or more processes indicates a memory sub-area dedicated for storing the respective operational state of the each process and information data associated with the respective operational state, the respective operational state being stored in the dedicated memory sub-area. At operation 308, the embedded-system device stores the information data associated with the respective operational state of each of the one or more processes in the dedicated memory sub-area of the each process.

At operation 310, the embedded-system device stores the memory locations associated with the one or more processes in a register in the memory. At operation 312, the embedded-system device obtains, from the register, a memory location of at least one process of the one or more processes. At operation 314, the embedded-system device obtains, based on the memory location of the at least one process, the stored operational state of the at least one process from the respective memory area for the at least one process. At operation 316, the embedded-system device receives a request through an Intelligent Platform Management Interface (IPMI) interface from a host computer or a remote device. The request includes an indication of the at least one process. The memory location of the at least one process is obtained from the register based on the indication. At operation 318, the embedded-system device sends an IPMI response to the host computer or the remote device, the IPMI response including the obtained operational state of the at least one process.

In certain configurations, each of the one or more processes operates in one or more operational states. In certain configurations, the respective operational state of each of the one or more processes is determined by the each process. In certain configurations, the respective operational state of each of the one or more processes is further determined based on a function of the each process being invoked. In certain configurations, the respective operational state of each of the one or more processes is determined a plurality of times throughout operation of the each process when the each process executes one or more functions. In certain configurations, the one or more functions include at least one of a write function, a read function, a listen function, a send function, and a wait function.

In certain configurations, the respective memory area for each of the one or more processes is a virtual memory area. The memory location of the each process is a virtual memory address. The operational state of the at least one process is obtained by a monitor process requesting data at the virtual memory address. In certain configurations, the respective memory area for each of the one or more processes is a virtual memory area. The memory location of the each process is a virtual memory address.

In certain configurations, the embedded-system device converts the virtual memory address of the at least one process to a physical memory address. The operational state of the at least one process is obtained by a monitor process requesting data at the physical memory address. In certain configurations, the embedded-system device stores the operational state of the at least one process obtained from the respective memory area of the at least one process in a non-volatile memory. In certain configurations, the operational state of the at least one process at different times are stored in the non-volatile memory to maintain a history of the operational states of the at least one process.

In certain configurations, a monitor process continuously monitors the operational states of the one or more processes at predetermined time points and stores the respective last predetermined number of operational states of each of the one or more processes in a non-volatile memory when a process of the one or more processes is terminated unexpectedly.

Figure 4:
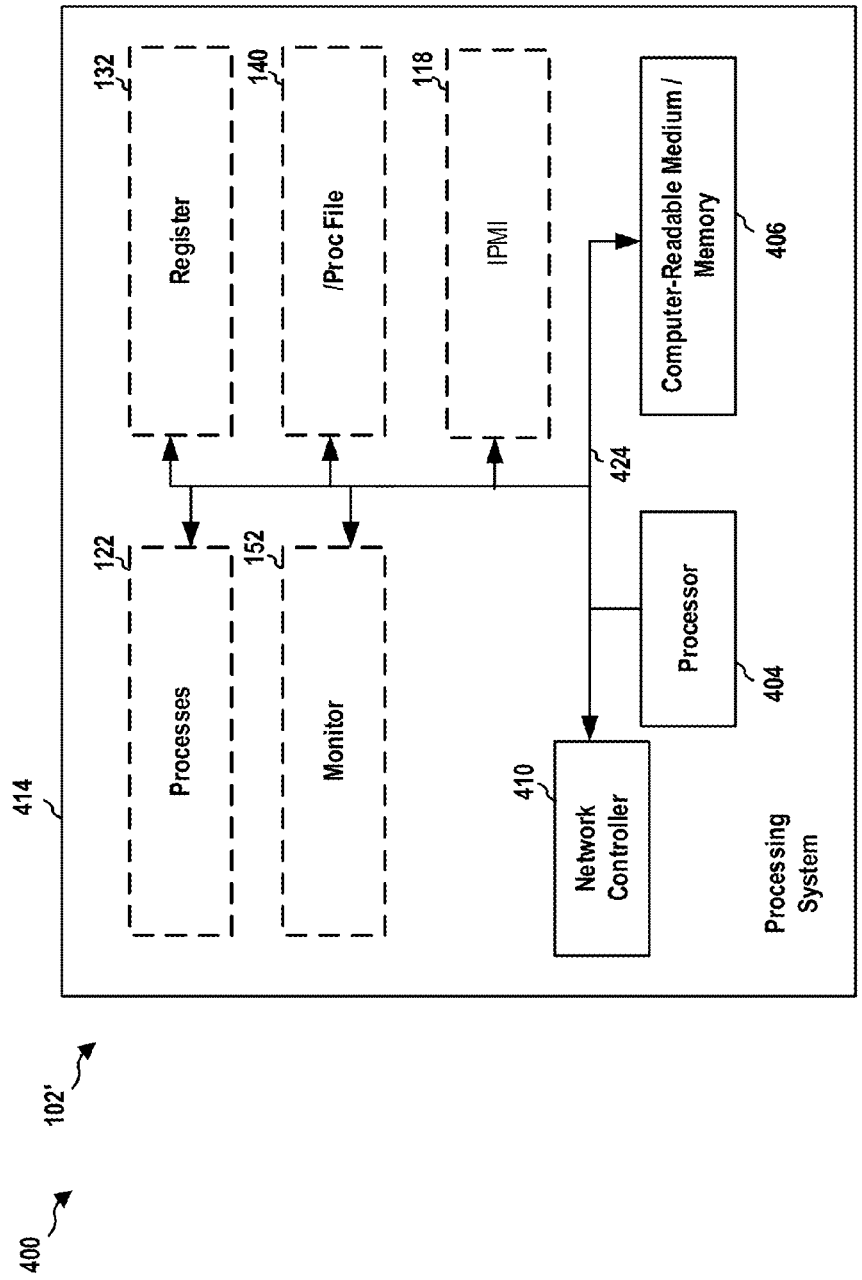
FIG. 4 is a diagram illustrating an example of a hardware implementation for an apparatus employing a processing system.

FIG. 4 is a diagram 400 illustrating an example of a hardware implementation for an apparatus 102' employing a processing system 414. The processing system 414 may be implemented with a bus architecture, represented generally by the bus 424. The bus 424 may include any number of interconnecting buses and bridges depending on the specific application of the processing system 414 and the overall design constraints. The bus 424 links together various circuits including one or more processors and/or hardware components, represented by the processor 404, the processes 122-1, 122-2, 122-3, 122-4, the monitor process 152, the register 132, the /proc file system 140, the IPMI interface 118, and the computer-readable medium/memory 406. In particular, the computer-readable medium/memory 406 may include the storage 117. The bus 424 may also link various other circuits such as timing sources, peripherals, voltage regulators, and power management circuits, which are well known in the art, and therefore, will not be described any further.

The processing system 414 may be coupled to a network controller 410. The network controller 410 provides a means for communicating with various other apparatus over a network. The network controller 410 receives a signal from the network, extracts information from the received signal, and provides the extracted information to the processing system 414, specifically the IPMI interface 118. In addition, the network controller 410 receives information from the processing system 414, specifically the IPMI interface 118, and based on the received information, generates a signal to be sent to the network. The processing system 414 includes a processor 404 coupled to a computer-readable medium/memory 406. The processor 404 is responsible for general processing, including the execution of software stored on the computer-readable medium/memory 406. The software, when executed by the processor 404, causes the processing system 414 to perform the various functions described supra for any particular apparatus. The computer-readable medium/memory 406 may also be used for storing data that is manipulated by the processor 404 when executing software. The processing system further includes at least one of the processes 122-1, 122-2, 122-3, 122-4, the monitor process 152, the register 132, the /proc file system 140, the IPMI interface 118. The components may be software components running in the processor 404, resident/stored in the computer readable medium/memory 406, one or more hardware components coupled to the processor 404, or some combination thereof.

The apparatus 102/102' may be configured to include means for performing each of the operations described supra referring to FIG. 3. The aforementioned means may be one or more of the aforementioned components of the apparatus 102 and/or the processing system 414 of the apparatus 102' configured to perform the functions recited by the aforementioned means.

Figure 5:
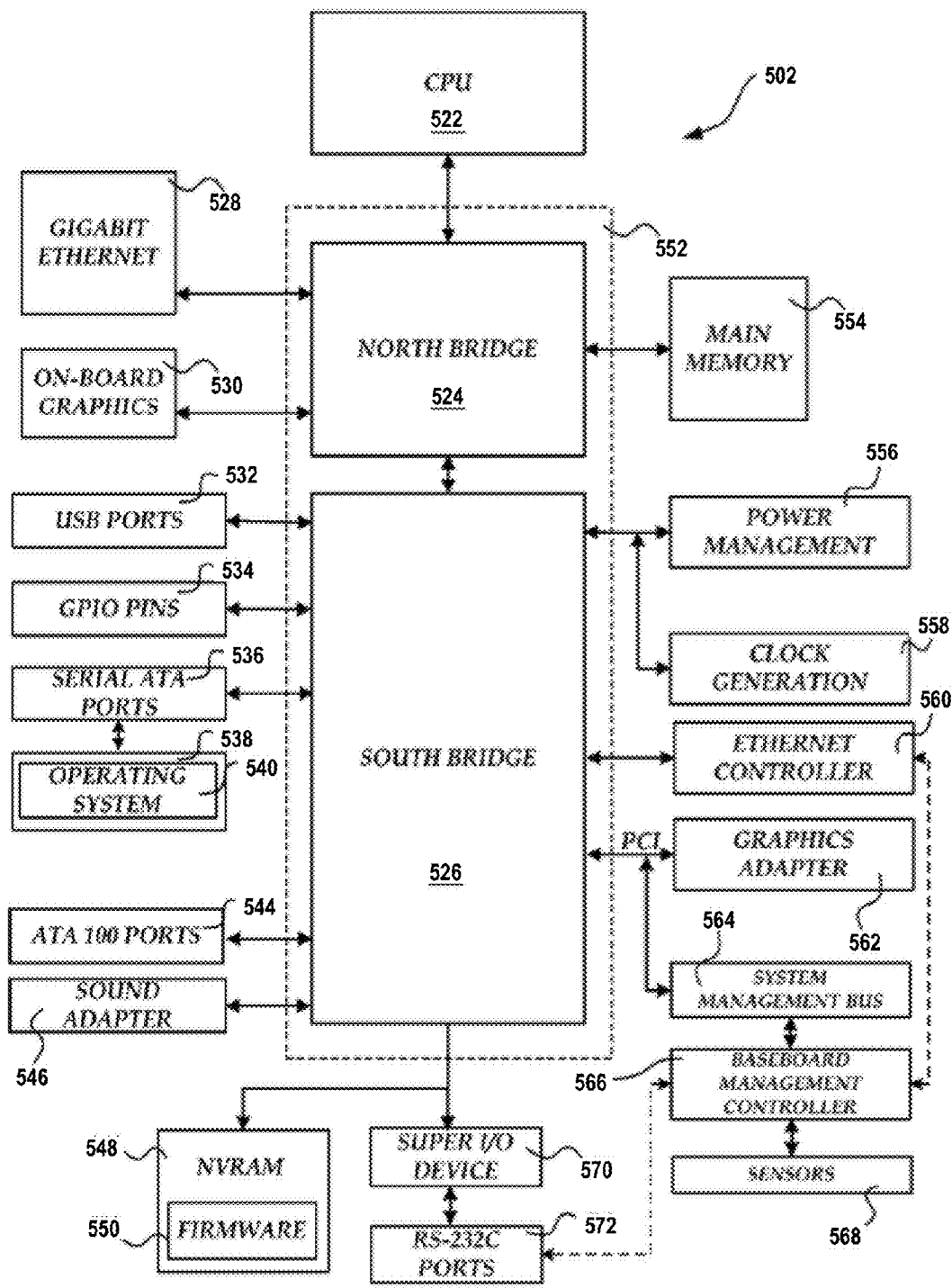
FIG. 5 shows a computer architecture for a computer.

FIG. 5 and the following discussion are intended to provide a brief, general description of one suitable computing environment in which aspects of the embodiments described herein may be implemented. In particular, FIG. 5 shows a computer architecture for a computer 502 that may be utilized to embody the host computer 190, as described supra. It should be appreciated that the computer architecture shown in FIG. 5 is merely illustrative and that other types of computers and computing devices may also be utilized to implement aspects of the embodiments presented herein.

While aspects presented herein include computer programs that execute in conjunction with the execution of an operating system, those skilled in the art will recognize that the embodiments may also be implemented in combination with other program modules and/or hardware devices. As described herein, computer programs include routines, programs, components, data structures, and other types of structures that perform particular tasks or implement particular abstract data types. Moreover, those skilled in the art will appreciate that the embodiments described herein may be practiced with other computer system configurations, including hand-held devices, multiprocessor systems, microprocessor-based or programmable consumer electronics, minicomputers, mainframe computers, and the like. The embodiments described herein may also be practiced in distributed computing environments where tasks are performed by remote processing devices that are linked through a communications network. In a distributed computing environment, program modules may be located in both local and remote memory storage devices.

The computer 502 shown in FIG. 5 includes a baseboard, or "motherboard," which is a printed circuit board to which a multitude of components or devices may be connected by way of a system bus or other electrical communication path. In one illustrative embodiment, a CPU 522 operates in conjunction with a chipset 552. The CPU 522 is a standard central processor that performs arithmetic and logical operations necessary for the operation of the computer. The server computer 502 may include a multitude of CPUs 522.

The chipset 552 includes a north bridge 524 and a south bridge 526. The north bridge 524 provides an interface between the CPU 522 and the remainder of the computer 502. The north bridge 524 also provides an interface to a random access memory ("RAM") used as the main memory 554 in the computer 502 and, possibly, to an on-board graphics adapter 530. The north bridge 524 may also include functionality for providing networking functionality through a gigabit Ethernet adapter 528. The gigabit Ethernet adapter 528 is capable of connecting the computer 502 to another computer via a network. Connections which may be made by the network adapter 528 may include LAN or WAN connections. LAN and WAN networking environments are commonplace in offices, enterprise-wide computer networks, intranets, and the internet. The north bridge 524 is connected to the south bridge 526.

The south bridge 526 is responsible for controlling many of the input/output functions of the computer 502. In particular, the south bridge 526 may provide one or more USB ports 532, a sound adapter 546, an Ethernet controller 560, and one or more general-purpose input/output (GPIO) pins 534. The south bridge 526 may also provide a bus for interfacing peripheral card devices such as a graphics adapter 562. In one embodiment, the bus comprises a PCI bus. The south bridge 526 may also provide a system management bus 564 for use in managing the various components of the computer 502. Additional details regarding the operation of the system management bus 564 and its connected components are provided below.

The south bridge 526 is also operative to provide one or more interfaces for connecting mass storage devices to the computer 502. For instance, according to an embodiment, the south bridge 526 includes a serial advanced technology attachment (SATA) adapter for providing one or more SATA ports 536 and an ATA 100 adapter for providing one or more ATA 100 ports 544. The SATA ports 536 and the ATA 100 ports 544 may be, in turn, connected to one or more mass storage devices such as the SATA disk drive 538 storing an operating system 540 and application programs.

As known to those skilled in the art, an operating system 540 comprises a set of programs that control operations of a computer and allocation of resources. An application program is software that runs on top of the operating system software, or other runtime environment, and uses computer resources to perform application specific tasks desired by the user. According to one embodiment of the invention, the operating system 540 comprises the LINUX operating system. According to another embodiment of the invention the operating system 540 comprises an operating system within the WINDOWS family of operating systems from MICROSOFT CORPORATION. According to another embodiment, the operating system 540 comprises the UNIX, LINUX, or SOLARIS operating system. It should be appreciated that other operating systems may also be utilized.

The mass storage devices connected to the south bridge 526, and their associated computer storage media, provide non-volatile storage for the computer 502. Although the description of computer storage media contained herein refers to a mass storage device, such as a hard disk or CD-ROM drive, it should be appreciated by those skilled in the art that computer storage media can be any available media that can be accessed by the computer 502.

By way of example, and not limitation, computer storage media may comprise volatile and non-volatile, removable and non-removable media implemented in any method or technology for storage of information such as computer-readable instructions, data structures, program modules or other data. Computer storage media also includes, but is not limited to, RAM, ROM, EPROM, EEPROM, flash memory or other solid state memory technology, CD-ROM, DVD, HD-DVD, BLU-RAY, or other optical storage, magnetic cassettes, magnetic tape, magnetic disk storage or other magnetic storage devices, or any other medium which can be used to store the desired information and which can be accessed by the computer.

According to embodiments, a low pin count (LPC) interface may also be provided by the south bridge 526 for connecting a "Super I/O" device 570. The Super I/O device 570 is responsible for providing a number of input/output ports, including a keyboard port, a mouse port, a serial interface 572, a parallel port, and other types of input/output ports. The LPC interface may also connect a computer storage media such as a ROM or a flash memory such as a non-volatile random-access memory (NVRAM) 548 for storing the firmware 550 that includes program code containing the basic routines that help to start up the computer 502 and to transfer information between elements within the computer 502.

As described briefly above, the south bridge 526 may include a system management bus 564. The system management bus 564 may include a BMC 566. The BMC 566 may be the embedded-system device 102. In general, the BMC 566 is a microcontroller that monitors operation of the computer system 502. In a more specific embodiment, the BMC 566 monitors health-related aspects associated with the computer system 502, such as, but not limited to, the temperature of one or more components of the computer system 502, speed of rotational components (e.g., spindle motor, CPU Fan, etc.) within the system, the voltage across or applied to one or more components within the system 502, and the available or used capacity of memory devices within the system 502. To accomplish these monitoring functions, the BMC 566 is communicatively connected to one or more components by way of the management bus 564. In an embodiment, these components include sensor devices 568 for measuring various operating and performance-related parameters within the computer system 502. The sensor devices 568 may be either hardware or software based components configured or programmed to measure or detect one or more of the various operating and performance-related parameters.

It should also be appreciated that the computer 502 may comprise other types of computing devices, including hand-held computers, embedded computer systems, personal digital assistants, and other types of computing devices known to those skilled in the art. It is also contemplated that the computer 502 may not include all of the components shown in FIG. 5, may include other components that are not explicitly shown in FIG. 5, or may utilize an architecture completely different than that shown in FIG. 5.

It is understood that the specific order or hierarchy of blocks in the processes/flowcharts disclosed is an illustration of exemplary approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

What is claimed is:

1. A method of operating an embedded-system device, comprising:
    determining a respective operational state of each of one or more processes loaded in a primary memory of the embedded-system device;
    storing the respective operational state of each of the one or more processes at a memory location in a respective memory area for the each process in the same primary memory;
    storing the memory locations associated with the one or more processes in a register in the same primary memory;
    obtaining, from the register, a memory location of at least one process of the one or more processes; and
    obtaining, based on the memory location of the at least one process, the stored operational state of the at least one process from the respective memory area for the at least one process.

2. The method of claim 1, wherein the respective memory location associated with each of the one or more processes indicates a memory sub-area dedicated for storing the respective operational state of the each process and information data associated with the respective operational state, the respective operational state being stored in the dedicated memory sub-area, the method further comprising:
    storing the information data associated with the respective operational state of each of the one or more processes in the dedicated memory sub-area of the each process.

3. The method of claim 1, wherein each of the one or more processes operates in one or more operational states.

4. The method of claim 1, wherein the respective operational state of each of the one or more processes is determined by the each process.

5. The method of claim 4, wherein the respective operational state of each of the one or more processes is further determined based on a function of the each process being invoked.

6. The method of claim 4, wherein the respective operational state of each of the one or more processes is determined a plurality of times throughout operation of the each process when the each process executes one or more functions.

7. The method of claim 6, wherein the one or more functions include at least one of a write function, a read function, a listen function, a send function, and a wait function.

8. The method of claim 1, further comprising:
    determining the memory location in the respective memory area of each of the one or more processes after that the each process is started and prior to that an initial operational state of the each process is determined.

9. The method of claim 1, wherein the respective memory area for each of the one or more processes is a virtual memory area, wherein the memory location of the each process is a virtual memory address, wherein the operational state of the at least one process is obtained by a monitor process requesting data at the virtual memory address.

10. The method of claim 1, wherein the respective memory area for each of the one or more processes is a virtual memory area, wherein the memory location of the each process is a virtual memory address, the method further comprising:
    converting the virtual memory address of the at least one process to a physical memory address, wherein the operational state of the at least one process is obtained by a monitor process requesting data at the physical memory address.

11. The method of claim 1, further comprising:
    receiving a request through an Intelligent Platform Management Interface (IPMI) interface from a host computer or a remote device, wherein the request includes an indication of the at least one process, wherein the memory location of the at least one process is obtained from the register based on the indication;
    sending an IPMI response to the host computer or the remote device, the IPMI response including the obtained operational state of the at least one process.

12. The method of claim 1, further comprising:
    storing the operational state of the at least one process obtained from the respective memory area of the at least one process in a non-volatile memory.

13. The method of claim 12, wherein the operational state of the at least one process at different times are stored in the non-volatile memory to maintain a history of the operational states of the at least one process.

14. The method of claim 1, wherein a monitor process continuously monitors the operational states of the one or more processes at predetermined time points and stores the respective last predetermined number of operational states of each of the one or more processes in a non-volatile memory when a process of the one or more processes is terminated unexpectedly.

15. An apparatus, the apparatus being an embedded-system device, comprising:
    a primary memory; and
    at least one processor coupled to the primary memory and configured to:
        determine a respective operational state of each of one or more processes loaded in the primary memory of the embedded-system device;
        store the respective operational state of each of the one or more processes at a memory location in a respective memory area for the each process in the same primary memory;
        store the memory locations associated with the one or more processes in a register in the same primary memory;
        obtain, from the register, a memory location of at least one process of the one or more processes; and
        obtain, based on the memory location of the at least one process, the stored operational state of the at least one process from the respective memory area for the at least one process.

16. The apparatus of claim 15, wherein the respective memory location associated with each of the one or more processes indicates a memory sub-area dedicated for storing the respective operational state of the each process and information data associated with the respective operational state, the respective operational state being stored in the dedicated memory sub-area, wherein the at least one processor is further configured to:
    store the information data associated with the respective operational state of each of the one or more processes in the dedicated memory sub-area of the each process.

17. The apparatus of claim 15, wherein each of the one or more processes operates in one or more operational states.

18. A non-transitory computer-readable medium storing computer executable code for operating an embedded-system device, comprising code to:

determine a respective operational state of each of one or more processes loaded in a primary memory of the embedded-system device;

store the respective operational state of each of the one or more processes at a memory location in a respective memory area for the each process in the same primary memory;

store the memory locations associated with the one or more processes in a register in the same primary memory;

obtain, from the register, a memory location of at least one process of the one or more processes; and obtain, based on the memory location of the at least one process, the stored operational state of the at least one process from the respective memory area for the at least one process.

19. The non-transitory computer-readable medium of claim 18, wherein the respective memory location associated with each of the one or more processes indicates a memory sub-area dedicated for storing the respective operational state of the each process and information data associated with the respective operational state, the respective operational state being stored in the dedicated memory sub-area, wherein the code is further configured to:

store the information data associated with the respective operational state of each of the one or more processes in the dedicated memory sub-area of the each process.

20. The non-transitory computer-readable medium of claim 18, wherein each of the one or more processes operates in one or more operational states.

* * * * *